United States Patent [19]

Stetter

[11] Patent Number: 5,631,561
[45] Date of Patent: May 20, 1997

[54] ARRANGEMENT FOR MEASURING AND CONTROLLING THE BASIC FIELD OF AN NMR TOMOGRAPHY APPARATUS

[75] Inventor: Eckart Stetter, Erlangen, Germany

[73] Assignee: Siemens Aktiengesellschaft, Munich, Germany

[21] Appl. No.: 451,564

[22] Filed: May 26, 1995

[30] Foreign Application Priority Data

May 31, 1994 [DE] Germany .................. 44 19 061.1

[51] Int. Cl.⁶ ........................................ G01R 33/28
[52] U.S. Cl. ............................... 324/322; 324/320
[58] Field of Search ............................ 324/318, 319, 324/320, 322; 335/299, 301, 302, 304; 128/653.2, 653.5

[56] References Cited

U.S. PATENT DOCUMENTS

| | | | |
|---|---|---|---|
| 4,070,611 | 1/1978 | Ernst | 324/309 |
| 4,284,950 | 8/1981 | Burl et al. | 324/320 |
| 4,623,844 | 11/1986 | Macovski | 324/320 |
| 4,788,502 | 11/1988 | Keller et al. | 324/318 |
| 4,950,994 | 8/1990 | Glover et al. | 324/320 |
| 5,200,701 | 4/1993 | Siebold et al. | 324/309 |
| 5,245,286 | 9/1993 | Carlson et al. | 324/319 |
| 5,320,103 | 6/1994 | Rapoport et al. | 324/318 |
| 5,373,239 | 12/1994 | Murek et al. | 324/320 |

FOREIGN PATENT DOCUMENTS

| | | |
|---|---|---|
| 0468415 | 1/1992 | European Pat. Off. . |
| 2276942 | 10/1994 | United Kingdom . |

Primary Examiner—Sandra L. O'Shea
Assistant Examiner—Raymond Y. Mah
Attorney, Agent, or Firm—Hill, Steadman & Simpson

[57] ABSTRACT

For measuring the basic field, at least one magnetic field probe is attached in the examination region of the nuclear magnetic resonance tomography system. The influence of the magnetic field gradients on the measurement is eliminated by a correction stage for pulsed magnetic field gradients arising from the switched gradients.

12 Claims, 10 Drawing Sheets

ARRANGEMENT FOR MEASURING AND CONTROLLING THE BASIC FIELD OF AN NMR TOMOGRAPHY APPARATUS

BACKGROUND OF THE INVENTION

1. Field of the Invention

The present invention is directed to an arrangement for measuring and controlling the basic (static) magnetic field of an NMR tomography apparatus.

2. Description of the Prior Art

Current nuclear magnetic resonance tomography systems generally operate using the Fourier method as described in U.S. Pat. No. 4,070,611. The nuclear magnetic resonance signal is thereby phase-encoded in at least one direction. This method presumes an extremely high temporal stability of the basic (static) magnetic field that serves for the polarization of the nuclear spins because the image quality would otherwise be substantially deteriorated by artifacts (smears in the direction of the phase-encoding gradient). This is set forth in greater detail in the book by E. Krestel, editor, "Bildgebende Systeme für die medizinische Diagnostik", 2nd edition, 1988, the section "Feldstabilitaet" on pp. 491 and 492. A field stability of up to less than 20–80 nT is required given the field strengths of 0.1–2.0 T as are currently standard for nuclear magnetic resonance tomography systems and the pulse sequences currently employed. This field stability must be maintained over a time span of a few ms up to several seconds (corresponding to a frequency range from a few tenths of a Hz up to a few tens of Hz); the demands decrease greatly at higher frequencies (or shorter times). Dependent on the strength of the basic field, this demand corresponds to a precision of 0.1 ppm–0.01 ppm and below.

This demand is true both of the field stability of the magnetic field generated by the basic field magnet itself as well as for external influences.

External noise sources, for example, are vehicles magnetized in the earth's magnetic field or in the stray field of the magnet that move in the proximity of the magnet or lines traversed by alternating current or by variable direct current (transformers, aerial contact lines of trains, etc.). Without special measures, such noise sources must be at a great distance from the location of the nuclear magnetic resonance tomograph apparatus in order to have no influence on its operations. A street car whose aerial contact line current is 500 A generates, for example, a noise field of 50 nT at a distance of two kilometers when it is assumed that the field drop-off is inversely proportional to the distance. In practice, it is hardly possible to find an installation location for a nuclear magnetic resonance tomography apparatus at which external noise influences remain within tolerable limits without special measures at the apparatus itself.

Various measures are known for avoiding field instabilities dependent on the type of magnet. A distinction must be made between the stability of the magnetic field generated by the apparatus itself and external disturbances. Permanent magnets must be temperature-stabilized so that they are adequately stable. Superconducting magnets in a standard short-circuit mode (field drop usually less than 0.1 ppm/hour) are inherently stable. The difficulty in the case of normally conductive magnets is keeping the supply current chronologically constant (to less than 0.1 ppm dependent on the field strength).

Superconducting magnets likewise have clear advantages with respect to external disturbances. Even if they do not have active stray field shieldings, they at least partially attenuate disturbances due to the Meissner-Ochsenfeld effect, by an approximate factor of 10. Given an active stray field shielding that is composed of an external shielding winding connected in series in an opposite direction to the current flow in the magnet, the shielding effect against external noise fields can be restored with a superconductor auxiliary winding composed of relatively few turns. Such an arrangement is disclosed by European Application 0 468 415. It has also been found that the refrigerated radiation shields in the superconductor cryostat attenuate field disturbances having frequencies higher than a few Hertz due to excited eddy currents rather well as a consequence of their good electrical conductivity.

By contrast, permanent magnets of the ring type, normally conductive air coil magnets in a Helmhotz arrangement as well as permanently magnetic or electromagnetic yoke magnets barely shield against external disturbances, particularly when they are constructed relatively open in order to achieve better patient accessibility. A yoke magnet having a single-sided yoke and an open structure is disclosed, for example, in U.S. Pat. No. 5,200,701.

An active noise field compensation is therefore usually required for magnet systems having permanent magnets or normally conductive magnets.

Such an arrangement is disclosed, for example, in U.S. Pat. No. 5,245,286. A sensor coil is placed around each pole shoe of the magnet, the respective magnet field being acquired therewith. By means of a spatially symmetrical arrangement of the sensor coils in the magnet and a series circuit, the influence of the pulsed gradients on the measured magnetic field is thereby eliminated. A compensation coil that surrounds the entire measurement compartment is driven dependent on a deviation of the magnetic field from a predetermined value that is acquired with the sensor coils. Neither dc offsets nor extremely low-frequency changes of the magnetic field, however, can be measured with sensor coils.

U.S. Pat. No. 4,234,950 discloses the use of MR probes for measuring field inhomogeneities of a magnet for nuclear magnetic resonance tomography apparatus. Use is made of the fact that the nuclear magnetic resonance frequency given a specific type of nucleus is strictly proportional to the applied magnetic field. Given this arrangement, however, the measurement of field inhomogeneities does not ensue during the image acquisition and in the absence of activated gradients. External field disturbances, however, can suddenly appear during the course of the pulse sequence. A control of the basic field only outside of the measuring cycles is thereby at most suitable for superconductor magnets since their cryostat shields shield against the higher-frequency parts of the noise fields.

SUMMARY OF THE INVENTION

An object of the present invention is to acquire temporal instabilities of the basic field of a nuclear magnetic resonance tomography system as exactly as possible, with a substantially continuous measurement.

This object is inventively achieved in a nuclear magnetic resonance tomography apparatus wherein at least one MR probe is attached in the examination region of the magnetic resonance apparatus as a magnetic field probe, and having correction means for pulsed magnetic field gradients that arise from switched gradients. Arbitrary low-frequency disturbances can also be acquired by employing a MR probe for magnetic field measurement. An exact compensation of noise field influences is possible by attaching the magnetic field probe in the examination region of the nuclear magnetic resonance tomography apparatus. The correction means enables a substantially interruption-free measurement of the basic magnetic field.

The correction means can be supplied with information about the switched condition of the gradients, so that the magnetic field changes (perturbations) arising at the magnetic field probe position due to the pulsed gradients caused by the gradient switching can be calculated therefrom, and these magnetic field changes are subtracted from the total measured values of the magnetic field probe. The magnetic field changes arising from the gradients can, for example, by measured once and then be entered in a table.

In an alternative embodiment, two magnetic field probes that are symmetrically arranged with respect to the magnet center are attached in the examination region of the magnet and the measured signals of the two magnetic field probes are added in the correction means such that the effect of pulse magnetic field gradients is eliminated. An acquisition of the basic magnetic field that is undisturbed by the gradients is thus also possible.

DESCRIPTION OF THE PREFERRED EMBODIMENTS

Figure 1:
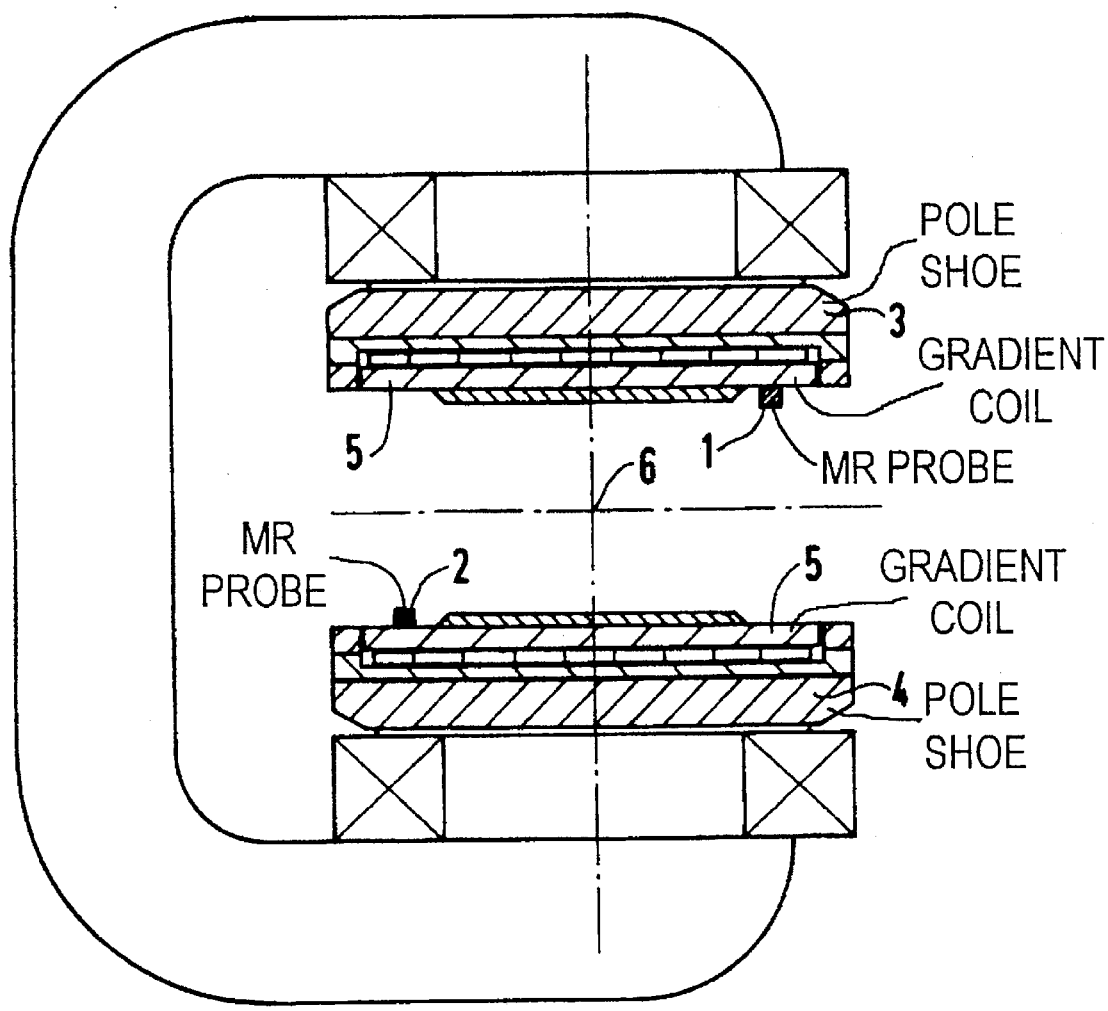
FIGS. 1–3 show various arrangements of magnetic field probes in nuclear magnetic resonance tomography apparatuses with different types of magnets.

FIG. 1 schematically an opposed pole magnet of a nuclear magnetic resonance tomography apparatus having a single-sided yoke connecting the pole shoes. The magnetic drive is not shown for clarity and can be composed either of permanent magnets or of normally conductive magnetic coils. Respective sets of gradient coils 5 are attached in the region of the pole shoes 3 and 4. The magnet center is referenced 6. Two magnetic field probes 1 and 2, referred to in brief below as "probes", are arranged symmetrically relative to this center. A single probe in the center of the system, where the basic field perturbation or boost (i.e., the disturbance) due to the pulsed gradients in all three axial directions is minimum, is not possible since a patient to be examined is located there in the operating condition of the apparatus. A probe disposed in the region of the pole shoes cannot, by itself, distinguish undesired basic field disturbances from the desired effects of the gradient fields. Additional correction measures would thus be required if only one magnetic field probe were employed. Given the placement of two probes centrally symmetrically relative to the magnet center, by contrast, the influence (contribution to the overall measured magnetic field) of gradient field pulses can be eliminated by adding the measured signals of both magnetic field probes and thus basic field disturbances (perturbations) can be measured.

Figure 2:
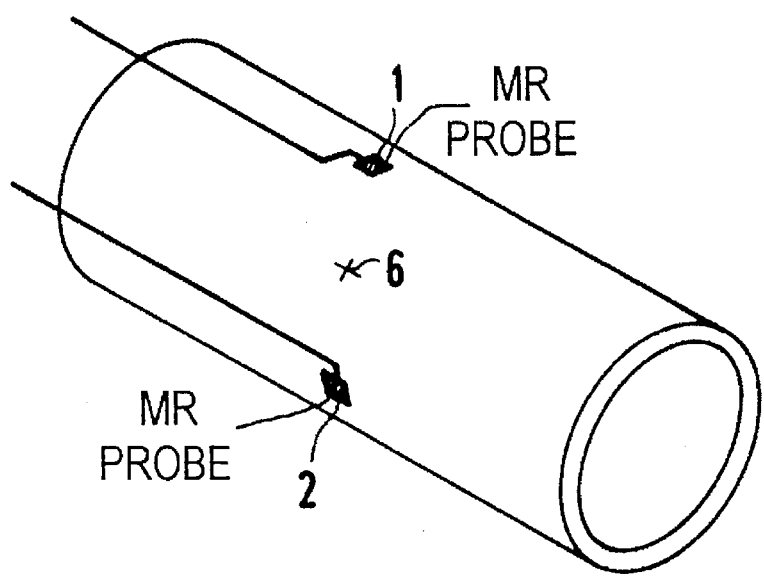
Figure 3:
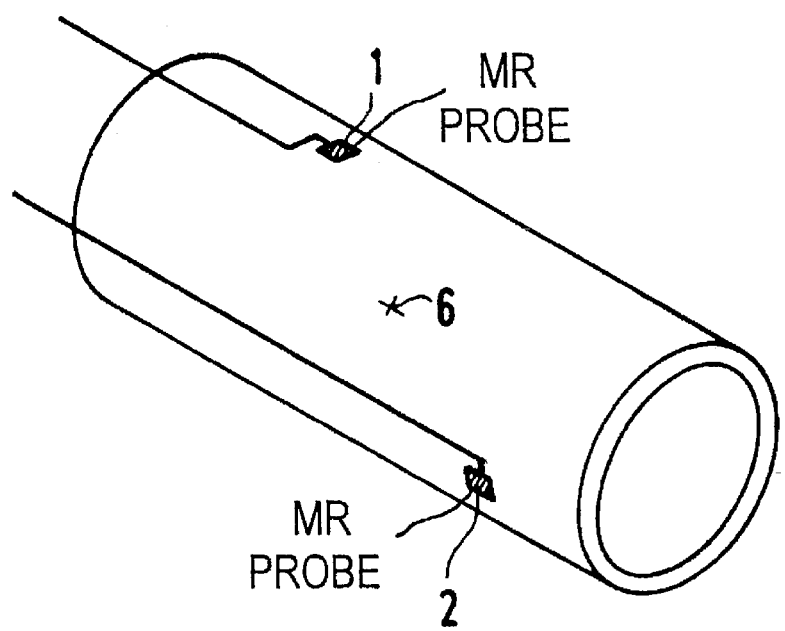
Figure 4:
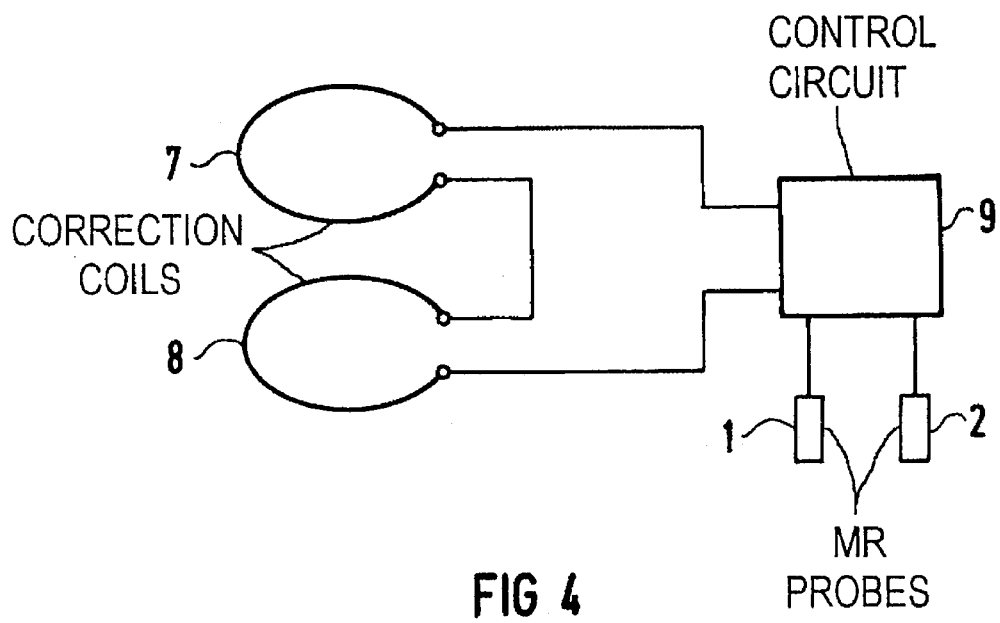
FIG. 4 schematically illustrates a control unit for the magnetic field.

FIGS. 2 and 3 show corresponding examples of probe positions given axial magnets. According to FIG. 2, the two probes 1 and 2 are positioned in the positions +y, −y. According to FIG. 3, however, they can also lie on a diagonal position (for example, −z, −x according to FIG. 3). What is important is that a symmetry exists with respect to the magnet coordinates, so that the probes 1 and respectively 2 "see" the pulsed gradient fields as field pulses of opposite polarity. Corresponding to the schematic illustration of FIG. 4, the output signals of the probes 1 and 2 are supplied to a control circuit (as part of the correction means) 9, where they are added so that the disturbances arising from the gradient pulses are eliminated. The output of the control circuit is connected to correction coils 7 and 8 with which the basic field of the magnet is adjusted or stabilized to a predetermined value.

MR probes are especially suitable for the magnetic field probes. Other known probes have various disadvantages. For example, pick-up coils acquire rapid field changes well, however, they require an integrator, that produces a drift, or the lower frequency limit is not zero. Slow field changes can also be unproblematically acquired with Hall generators; in the high basic field, however, these are not exact enough and also exhibit thermal drift. Slow field changes can also be acquired with flux gates; the precision and the high basic field, however, is likewise unsatisfactory.

MR probes, by contrast, can be employed well in the high basic field and only those field components that are also the determining factor for the nuclear magnetic resonance tomography are acquired. The field measurement is also exact and practically unlimited to fashion given arbitrarily slow field changes. When, however, conventional continuous-wave methods are applied in combination with lock-in detection, fast field changes of a type that are unavoidably generated by the pulsed gradients cannot be acquired. MR probes are therefore preferably employed that operate according to the pulse-NMR spectrometer principle. This principle is known for spectrometers from, for example, D. Shaw, Fourier Transform NMR Spectroscopy, Scientific Publ. Co. Amsterdam, 1976, Chapter 6, p. 121.

Figure 5:
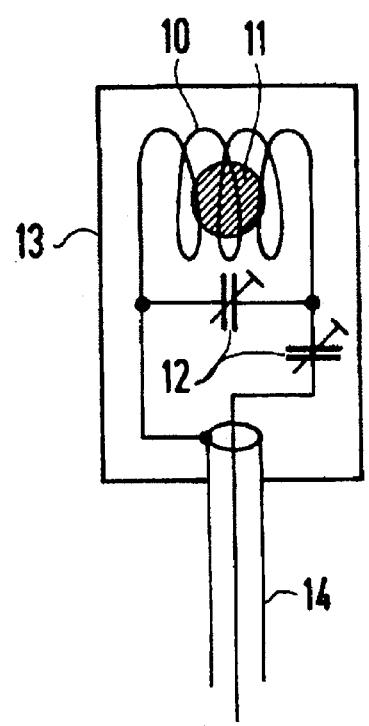
FIG. 5 schematically illustrates the structure of a MR probe as magnetic field probe.

FIG. 5 schematically shows the structure of an MR probe 13. A probe specimen 11 is arranged in a coil 10. The coil 10 is connected via a matching circuit to trimmer capacitors 12 and is connected via a coaxial line 14 to a measurement circuit. Nuclear spins are excited in the probe specimen 11 via the coil 10 and then generate a nuclear magnetic resonance signal. The operating frequency of the probe depends on the magnetic field and on the material of the probe specimen. Expediently, a liquid or a gel having a high density of MR-suitable nuclei with a long T2 time is employed as probe specimen material. When, for example, water is employed, then the operating frequency of the MR probe will coincide with the operating frequency of the nuclear magnetic resonance tomography apparatus with which proton imaging is usually implemented. So that the radio-frequency supplied to the MR probe does not disturb the measuring procedure for the image, an extremely good shielding of the MR probe and the feeder thereof must be implemented. Alternatively, a probe specimen material having atomic nuclei whose magnetic resonance frequency deviates from the proton resonance frequency can be utilized. For example, fluorine compounds would be well-suited for this purpose because of their high MR-sensitivity.

Figure 6:
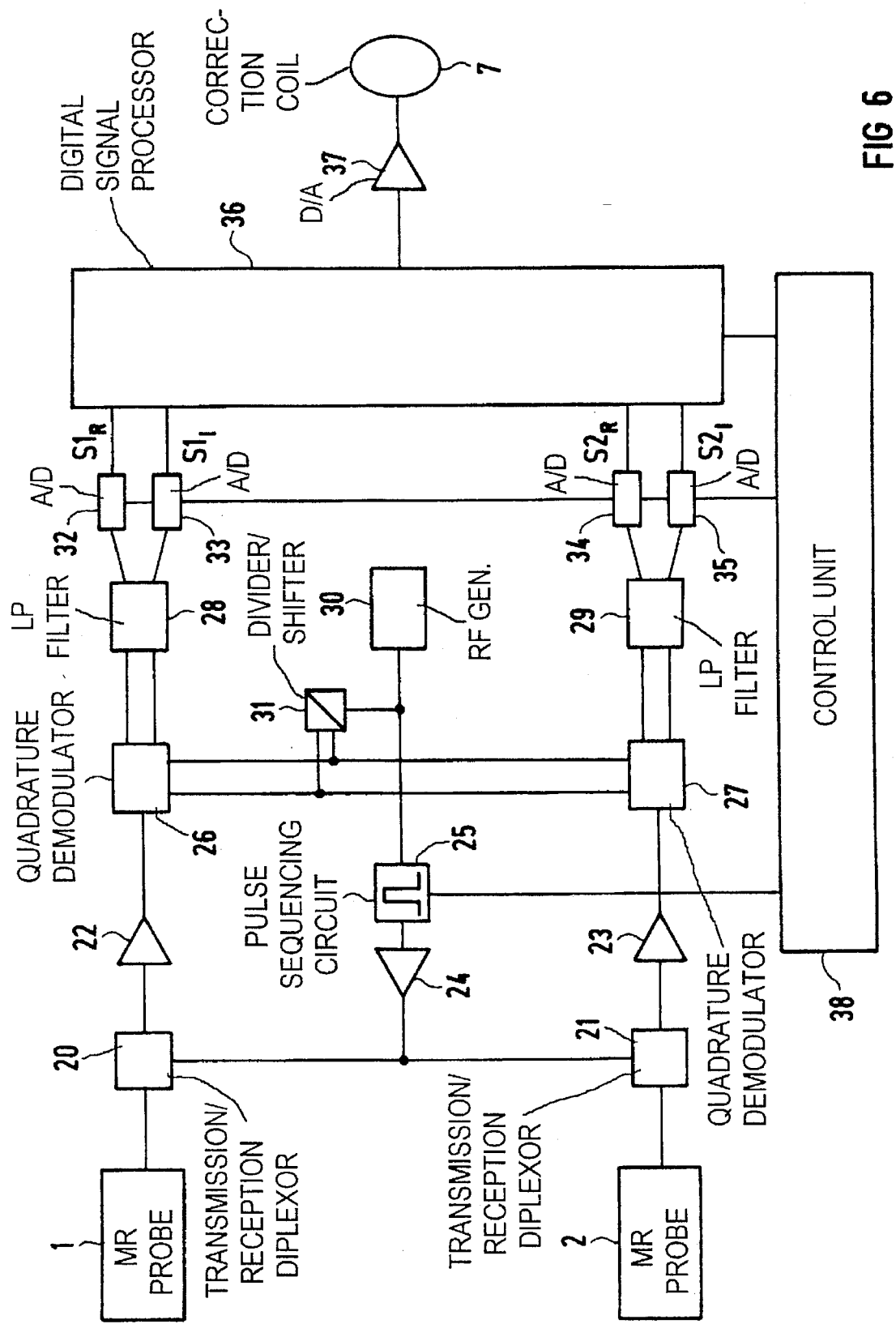
FIG. 6 shows a first embodiment of an evaluation circuit for the measured signals of the MR magnetic field probes.

FIG. 6 shows a first circuit example for operating the probes 1 and 2. The probes 1 and 2 are thereby connected via transmission/reception diplexors 20 and 21 either to the output of a radio-frequency amplifier 24 or to respective inputs of radio-frequency amplifiers 22 and 23. A radio-frequency generator 30 is provided for generating the transmission signal, which drives the input of the radio-frequency amplifier 24 via a pulse sequencing control circuit 25 in the transmission mode.

In the reception mode, the output signals of the radio-frequency signal amplifiers 22 and 23 are respectively supplied to quadrature demodulators 26 and 27. The quadrature demodulators 26 and 27 receive reference signals from the radio-frequency generator 30, whereby two signals phase-offset by 90° by a phase shifter are employed, supplied via a signal divider/shifter 31. The two signals generated by each quadrature detector 26 or 27 (corresponding to the real and imaginary part), are supplied to analog-to-digital converters 32–35 via respective low-pass filters 28 and 29. The digital output signals of the analog-to-digital converters 32–35 are processed in a digital signal processor 36 to form a control signal, are converted into analog signals by a digital-to-analog converter 37, and are then supplied to a correction coil 7 for the basic magnetic field. The overall arrangement is controlled by a control unit 38.

Figure 7:
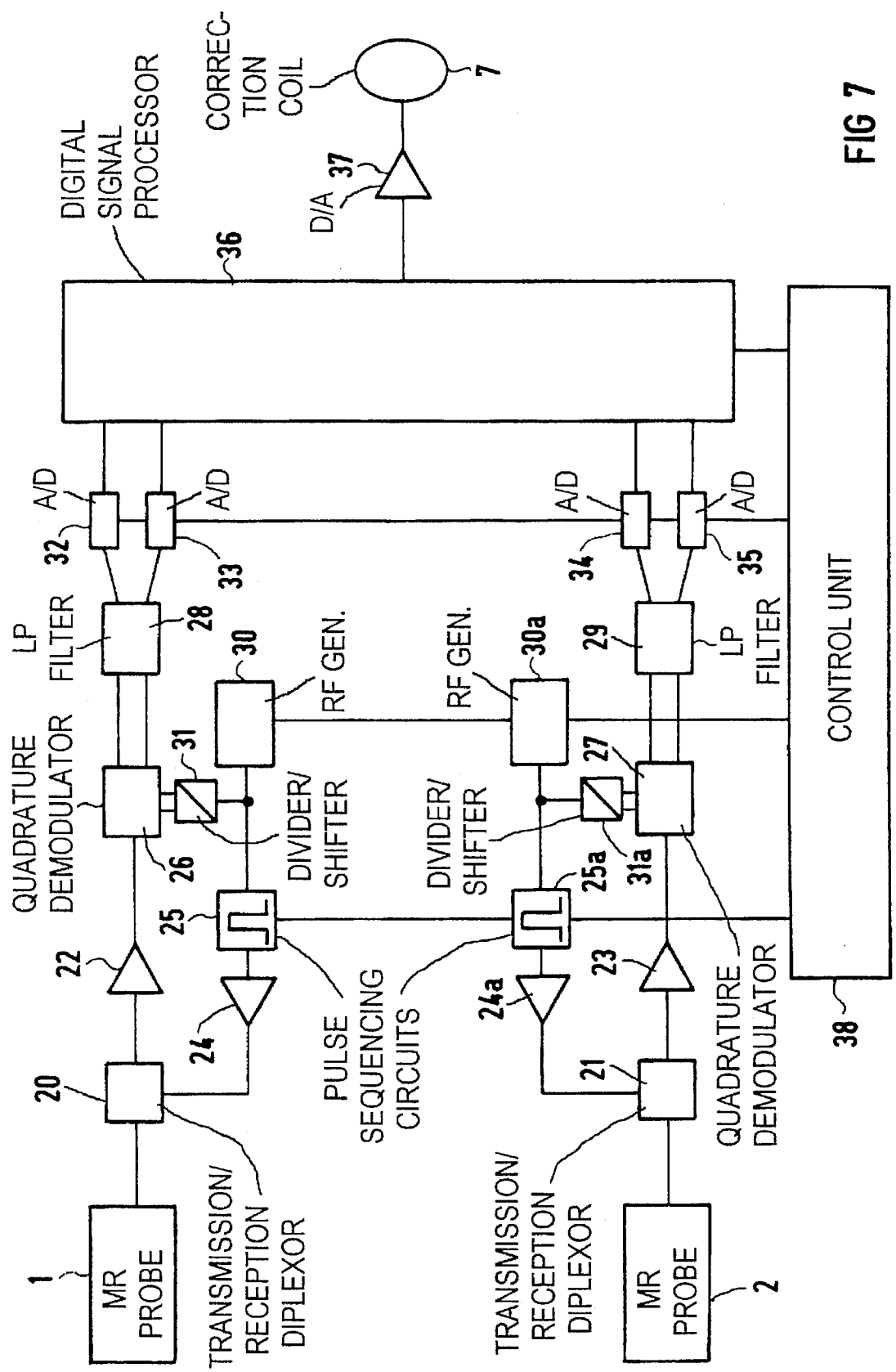
FIG. 7 shows a second embodiment of an evaluation circuit for the measured signals of the MR magnetic field probes.

Alternatively, separate radio-frequency generator 30 and 30a having following pulse-control circuits 25 and 25a and radio-frequency amplifiers 24 and 24a can be employed for each transmission/reception channel, as shown in FIG. 7.

Figure 8:
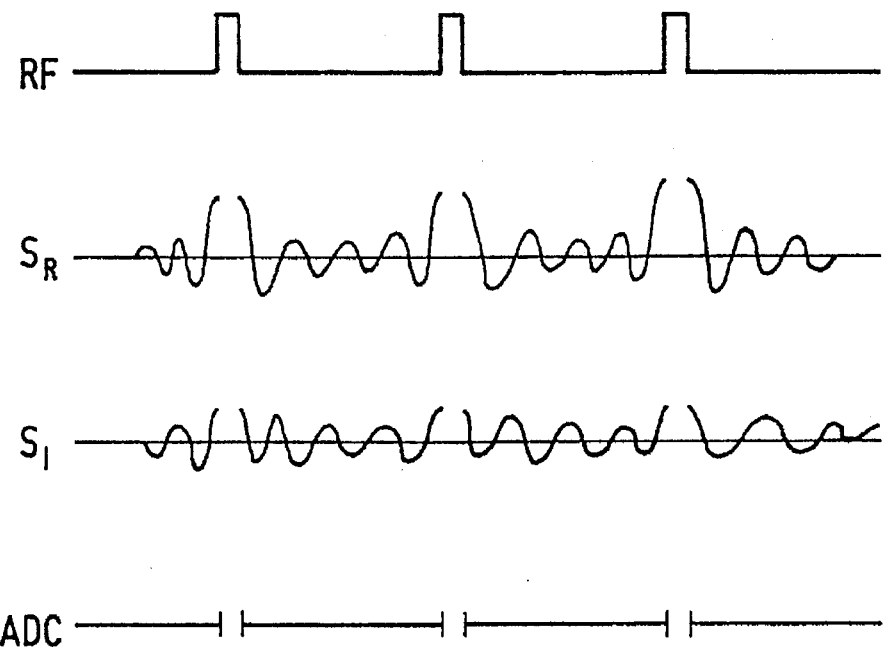
FIG. 8 shows a pulse diagram for the magnetic field measurement in an MR probe.

FIG. 8 shows the sequence of the radio-frequency pulses RF and the curve of the MR signal with real part $S_R$ and imaginary part $S_I$. The probe is operated in what is referred to as the steady-state-free precession mode. The radio-frequency signals RF are extremely short since their chronological duration represents an undesired dead time for the measurement. Further, the radio-frequency pulses must be broadband, i.e., they cannot be frequency-selective, because the pulse gradients may generate large MR frequency shifts under certain circumstances.

Figure 9:
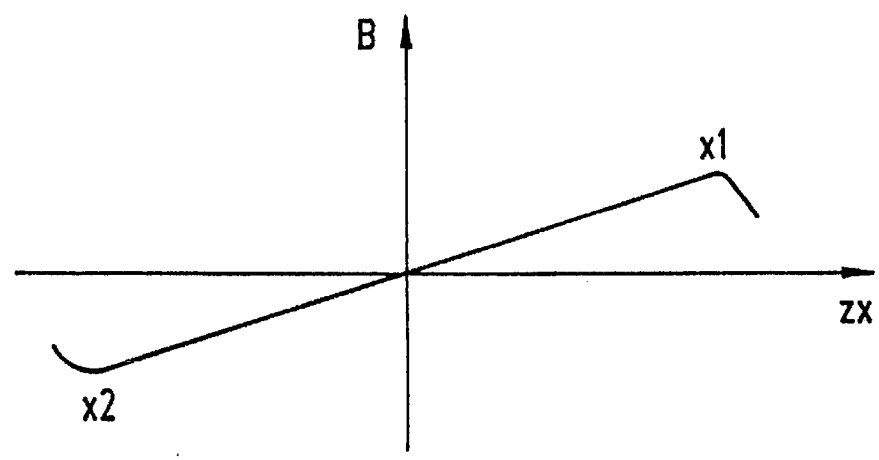
FIG. 9 shows the field course of a gradient field along a zx-direction in a nuclear magnetic resonance tomography apparatus.

FIG. 8 also shows the operating condition of the analog-to-digital converter ADC, whereby the intervals wherein the measured signal are sampled are identified with a solid line. The repetition rate of the radio-frequency pulses RF should be low so that the ratio between dead time and measuring time is low. The required spacing of the radio-frequency pulses is essentially based on the $T_2^*$ time of the probe 11, this being established by the material itself as well as by the size and shape of the probe. It must be taken into consideration that the probe 11 is usually situated in the non-homogeneous field (at least because of the gradients activated at times). This problem, however, can be alleviated by attaching the probes 1 and 2 at respective positions in the MR apparatus that have a low, local field gradient. These positions are referenced x1 and x2 as an example in FIG. 9, which shows the course of the magnetic field b over the x-axis.

Overall, thus, probe size, probe location and pulse spacing must be selected, taking the field distribution in the nuclear magnetic resonance tomograph to be determined into consideration, such that an adequate signal-to-noise ratio arises at all times.

A liquid or a gel having a density and MR-suitable nuclei with long T2 time is preferably employed as probe material. Water, hydrocarbon or the like are suitable. When the probes 1 and 2 are operated at the resonant frequency of the protons, good shielding of the overall arrangement must be assured. The imaging in the MR apparatus also typically ensues on the resonant frequency of protons. Since the magnetic field measurement should also continue during the measurement of the nuclear magnetic resonance signals required for the imaging, pronounced mutual influencings would occur without shielding.

When the MR probes 1 and 2 are operated at the proton resonant frequency, however, the advantage is achieved derives that a common (single) radio-frequency generator can be employed for the definition of the radio-frequency transmission pulses for the imaging and for the magnetic field measurement.

Specimens having different nuclei, however, can also be utilized in the probes 1 and 2, the MR resonant frequency thereof differing from that of protons. For example, fluorine compounds (flurohydrocarbons) are well-suited because of their high MR-sensitivity.

Using the above-described method, thus, both probes emit a nuclear magnetic resonance signal that is uninterrupted except for the brief transmission pulses, the frequency thereof, conforming to the Larmor relationship $\omega=\gamma\cdot B$, being absolutely exactly proportional at all times to the momentary magnetic field prevailing at the specimen location.

The further processing of the probe signals demodulated in the circuit according to FIG. 6 or, respectively, 7 ensues digitally in a digital signal processor 36.

Figure 10:
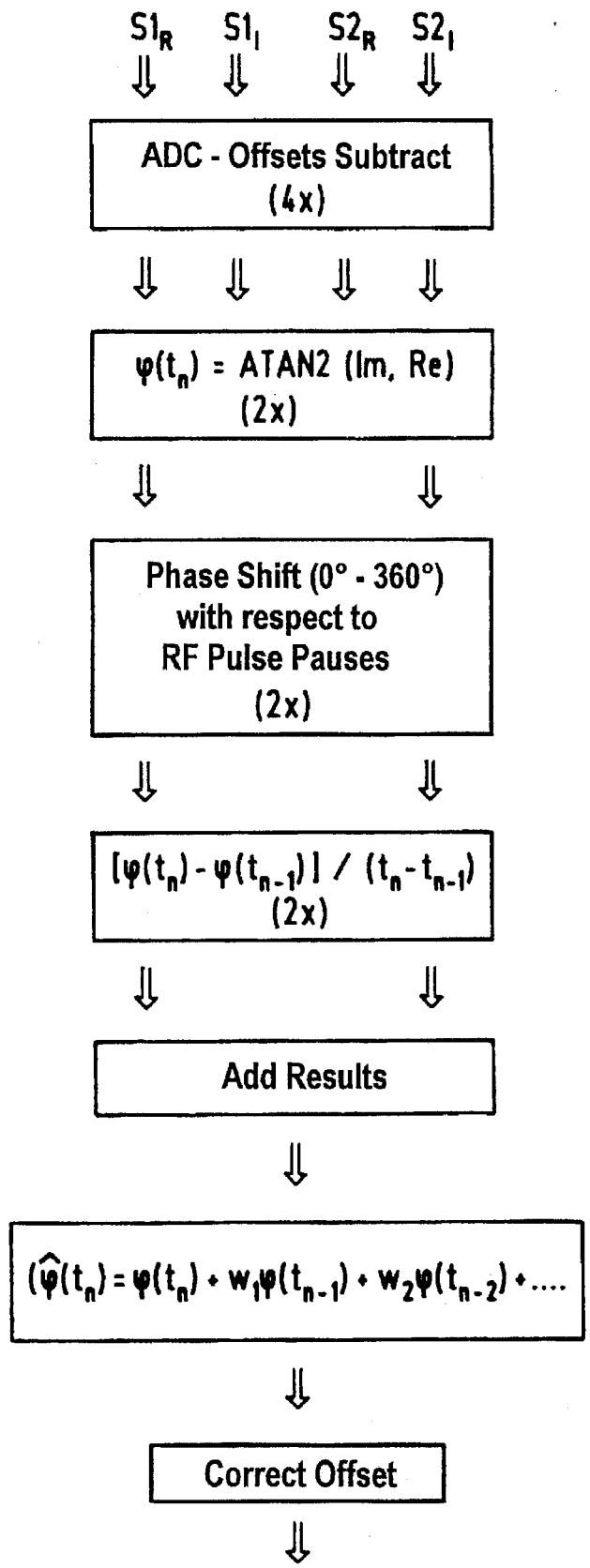
FIG. 10 is a flowchart for evaluating the MR signals corresponding to FIGS. 6 and 7 and for the calculation and compensation of field instabilities.

FIG. 10 shows a flowchart of the signal processing in the digital signal processor 36. The digital signal processor 36 is supplied with real part and imaginary part of the nuclear magnetic resonance signal for each probe 1 and 2, i.e. with four signals $S1_R$, $S1_I$, $S2_R$, $S2_I$. The offsets of the preceding analog-to-digital converters 32–35 are then calculated and subtracted. This function can be repeated from time to time in measuring pauses in order to compensate offset drift.

The identification of the frequency of the MR signals in this method advantageously occurs not on the basis of Fourier transformation of the time signal but by calculating the time derivative of the phase ($\omega=d\Phi/dt$). The phase $\Phi(t_n)$ is identified by a four-quadrant evaluation of the arctangent of the real and imaginary parts. This method has the great advantage that it continuously acquires each frequency change immediately.

Figure 11:
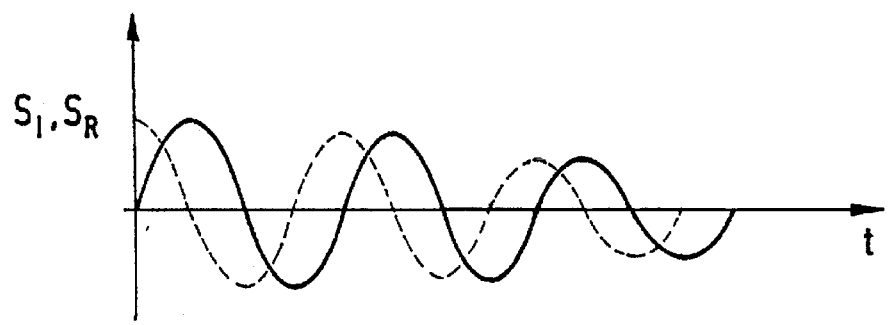
FIGS. 11–13 show the phase curves of the output signal of a MR probe with a method for eliminating instability locations.
Figure 12:
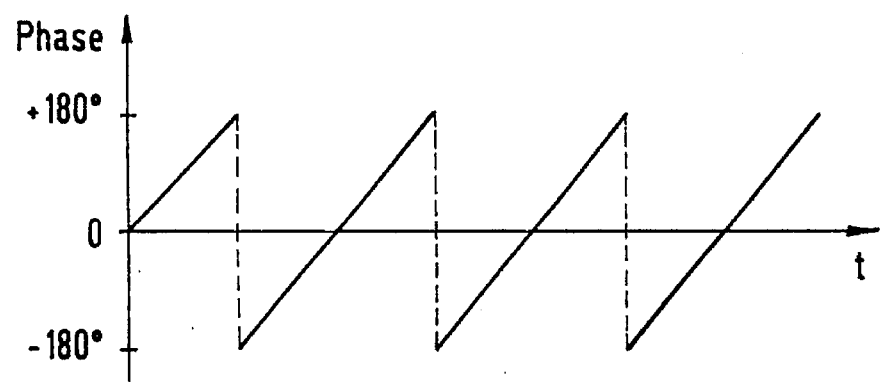
Figure 13:
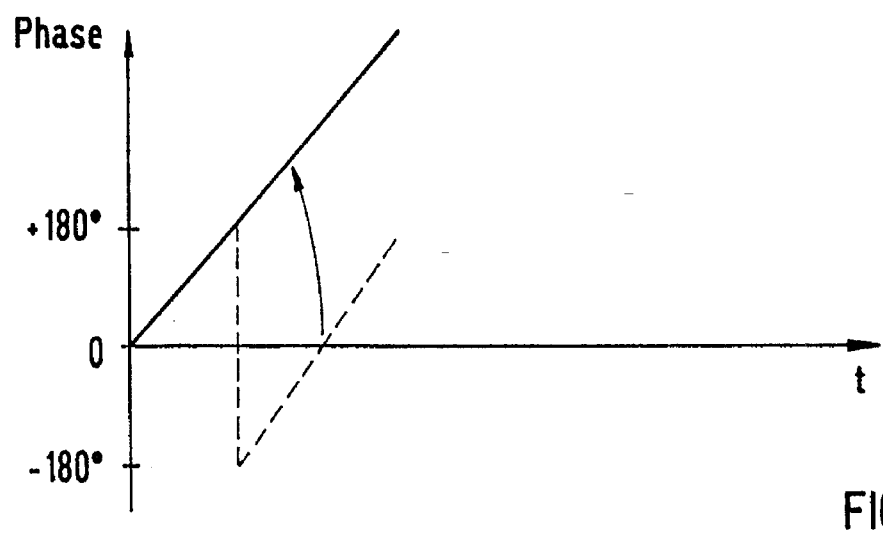

Further, the digital signal processor 36 contains a function that effects a matching of the chronological phase curve at transition locations. This is set forth below with reference to FIGS. 11–13. FIG. 11 shows the signal curve of real part $S_R$ and imaginary part $S_I$ of the demodulated nuclear magnetic resonance signal of the probe. As can be seen in FIG. 12, the phase curve has discontinuities of +180° to −180°. Problems in the evaluation thus occur. In order to avoid this, the phase curves are shifted to produce a continuous transition.

Figure 14:
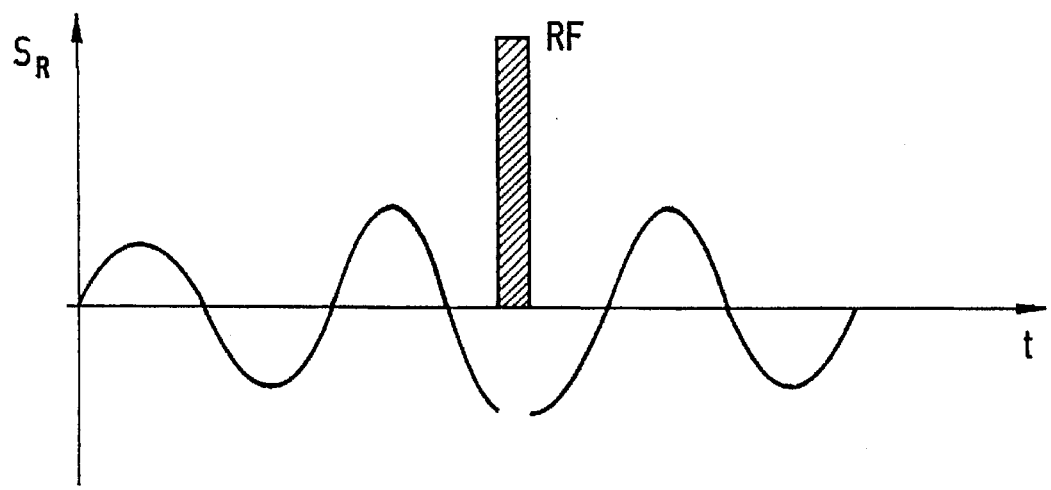
FIGS. 14 and 15 respectively show the time curve of the RF pulses and MR signals, and their phase curve with bridging of the gaps caused by emitting RF pulses into a subject.
Figure 15:
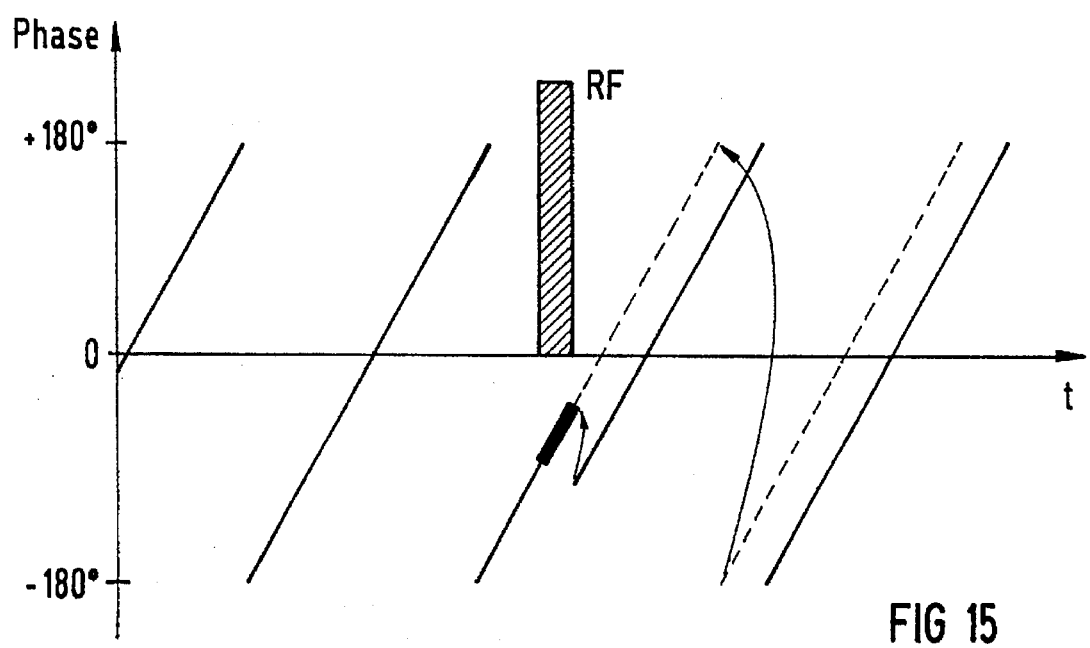

Care must also be exercised to ensure that an adaptation of the chronological phase curve ensues at the discontinuities caused by the RF pulses. FIG. 14 shows the real part $S_R$ of a nuclear magnetic resonance signal of the probes 1 and 2, this signal being interrupted during a radio-frequency pulse RF. As indicated in FIG. 15 with a solid, bold-face line, a linear extrapolation occurs during the interruption time. The measured values of the phase are identified with a solid line in FIG. 15, the extrapolated part is identified with a solid, bold-face line, and the measured values shifted to the end point of the extrapolation are indicated with a broken line. As indicated by the arrows in FIG. 15, the measured values acquired after the extrapolation must be shifted so that a curve without gaps arises. Moreover, the shift set forth above with reference to FIG. 12 also ensues in order to avoid the 360° discontinuities.

The frequency of the nuclear magnetic resonance signals of the two probes S1 and S2, which is proportional to the MR signal present at the probe position, is identified by forming the quantity $[\Phi(t_n)-\Phi(t_n-1)]/(t_n-t_n-1)$. Finally, the results are added, so that the effect of gradient pulses is eliminated. Due to the spatial anti-symmetry of all pulsed gradient fields with respect to the middle of the magnet and due to the central-symmetrical arrangement of the specimens, the influences of the gradient pulses are eliminated and only the basic field component remains. Low-pass filtering of the result of the addition is undertaken.

Since the basic field (without gradient pulses) can be different at the two selected probe positions (field offset), an offset of the output signal may occur under certain circumstances. This constant field offset can be identified and subtracted. Given a circuit of FIG. 7 having two radio-frequency generators 30 and 30a, the two radio-frequency generators 30 and 30a can be operated with different frequencies that are synchronized relative to one another corresponding to the basic field for the two probes 1 and 2. After the activation of the system, the radio-frequency generators 30 and 30a are each set to respective frequencies such that a frequency of zero occurs at the output of the respective quadrature demodulators in the quiescent condition.

The external or internal field disturbances—which must be eliminated—can be identified with the described method without contributions due to gradient pulses. It is also advantageous that field discontinuities or eddy fields having a uniform field distribution that are generated due to possible asymmetries of the gradient coils are likewise acquired.

The clock rate with which the acquisition and processing of the measured data ensues is dependent on the position of the probes 1 and 2 and on the gradient fields that are applied. The data acquisition and processing, however, must at least ensue with a clock rate that satisfies the Nyquist theorem with respect to the MR frequency shift of the nuclear magnetic resonance signal that is caused by the gradient pulse.

The digital signal obtained in this way for the actual value of the magnetic field strength is now converted into an analog signal via a digital-to-analog converter 37, this being supplied after corresponding amplification to an auxiliary field coil 7 that compensates the field disturbances.

Figure 16:
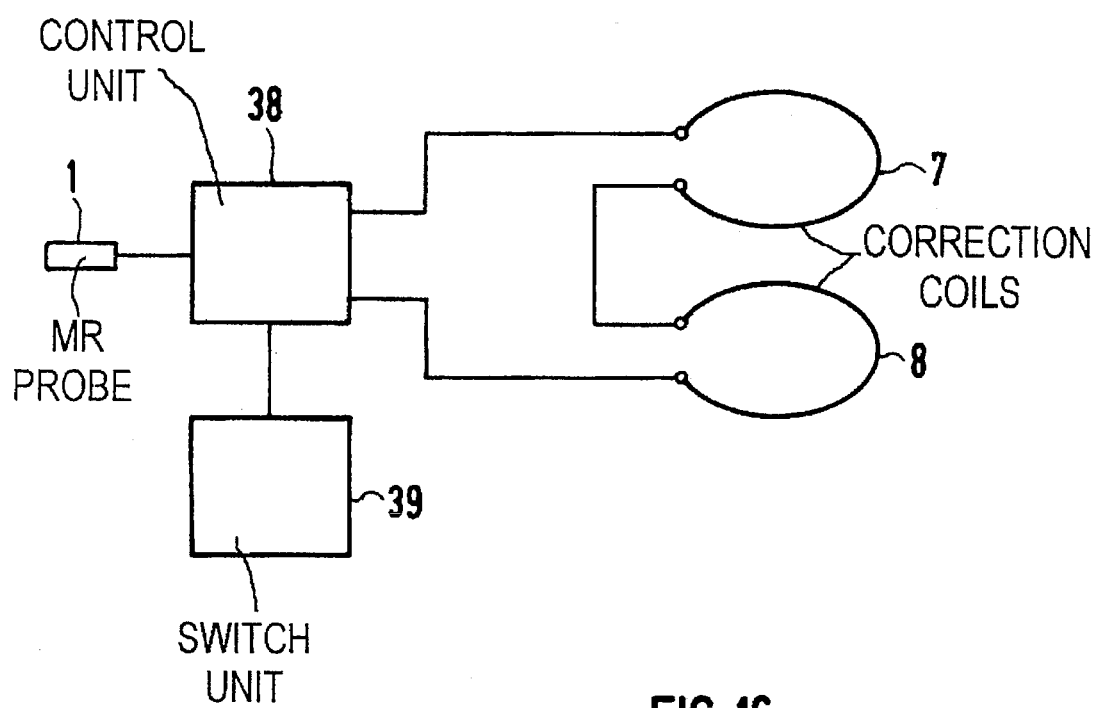
FIG. 16 shows a circuit wherein a correction means is supplied with information about the switched status of the gradients.

In an alternative circuit as schematically shown in FIG. 16, only one magnetic field probe 1 is employed in the examination space of the nuclear magnetic resonance tomography apparatus, the output signal thereof being supplied to a correction unit 38. The correction unit 38 is supplied with information about the switch status of the gradients from a gradient switch unit 39. The magnetic field changes due to gradient switching occurring at the magnetic field probe position are calculated therefrom. This can ensue, for example, with a table wherein the effects of the individual gradients on the magnetic field probe position are stored. On the basis of this information, the measured signal of the magnetic field probe 1 can then be corrected, so that an output signal is obtained that is free of the disturbing influences of the gradients and can be utilized for correcting the magnetic field.

Although modifications and changes may be suggested by those skilled in the art, it is the intention of the inventor to embody within the patent warranted hereon all changes and modifications as reasonably and properly come within the scope of his contribution to the art.

I claim as my invention:

1. A nuclear magnetic resonance tomography apparatus comprising:

a basic field magnet which generates a basic magnetic field in an examination region;

a plurality of gradient coils and means for operating said gradient coils for producing switched magnetic field gradients in said examination region superimposed on said basic magnetic field;

at least one magnetic field probe disposed in said examination region comprising an MR probe, said MR probe generating an output signal dependent on the magnetic field measured at the location of said MR probe; and correction means for correcting the influence of said switched gradients on said output signal for producing a measuring value representing the basic magnetic field without contributions of said switched gradients.

2. An apparatus as claimed in claim 1 further comprising field correction means for controlling said basic magnetic field, which are supplied with said measuring value.

3. An apparatus as claimed in claim 1 further comprising means for supplying said correction means with information identifying a switching condition of said switched gradients, wherein said correction means comprises means for identifying contributions in said output signal arising from said pulsed magnetic field gradients and means for subtracting said contributions from said output signal.

4. An apparatus as claimed in claim 1 wherein said basic magnetic field has a center, and said apparatus further comprising two of said magnetic field probes, each comprising an MR probe, symmetrically disposed in said examination region relative to said center of said basic magnetic field, each of said magnetic field probes supplying an output signal to said correction means and said correction means comprising means for adding the respective output signals from said magnetic field probes to obtain a measuring value by eliminating a contribution of said pulsed magnetic field gradients to said measuring value.

5. An apparatus as claimed in claim 4 wherein said examination region contains locations having small local field gradients and wherein said two magnetic field probes are respectively disposed at said locations.

6. An apparatus as claimed in claim 1 wherein said examination region has locations having small local field gradients, and wherein said at least one MR probe is disposed at one of said locations.

7. An apparatus as claimed in claim 1, wherein said magnetic field probe comprises a transmission/reception antenna and means for supplying said transmission/reception antenna with a sequence of RF pulses for exciting nuclear spins in a specimen in said magnetic field probe and for receiving nuclear magnetic resonance signals arising in said specimen as a result of said nuclear spins, said nuclear spins having a T2* time associated therewith, and the time between the successive RF pulses being in the order of said T2* time, said nuclear magnetic resonance signals being received and phase-sensitively demodulated between said RF pulses.

8. An apparatus as claimed in claim 7 wherein said nuclear magnetic resonance signals arising from said specimen exhibit a reciprocal frequency shift caused by the respective pulsed magnetic field gradients, and wherein said means for supplying said transmission/reception antenna with RF pulses comprises means for supplying said transmission/reception antenna with RF pulses which are short in comparison to said reciprocal frequency shift.

9. An apparatus as claimed in claim 8 further comprising means for acquiring and processing said nuclear magnetic resonance signals with a clock rate which satisfies the Nyquist theorem with respect to said reciprocal frequency shift.

10. An apparatus as claimed in claim 1 further comprising a transmission/reception antenna and means for supplying said transmission/reception antenna with a sequence of RF pulses for exciting nuclear spins in a specimen in said magnetic field probe and for receiving nuclear magnetic resonance signals arising from said nuclear spins in said specimen, said nuclear magnetic resonance signals having an MR frequency and a phase associated therewith, and means for calculating said MR frequency by time differentiation of said phase of said nuclear magnetic resonance signals.

11. An apparatus as claimed in claim 1 wherein said apparatus has an operating frequency, and further comprising a probe specimen, disposed in said examination region when said magnetic field is being measured by said magnetic field probe, said probe specimen consisting of material having a nuclear magnetic resonant frequency deviating from said operating frequency.

12. An apparatus as claimed in claim 1 wherein said examination region has locations having small local field gradients, and wherein said at least one MR probe is disposed at one of said locations, said apparatus having an operating frequency and said MR probe comprises material having a nuclear magnetic resonant frequency coinciding with said operating frequency, and said means for supplying said transmission/reception antenna with a sequence of RF pulses and said correction means comprise a common RF generator for generating said sequence of RF pulses and for generating reference signals for phase-sensitively demodulating said nuclear magnetic resonance signals and for phase-sensitively demodulating said output signal of said magnetic field probe.

\* \* \* \* \*